United States Patent
Khatavkar et al.

(10) Patent No.: US 10,756,748 B1
(45) Date of Patent: Aug. 25, 2020

(54) CAPACITOR-ENHANCED COMPARATOR FOR SWITCHED-CAPACITOR (SC) CIRCUITS WITH REDUCED KICKBACK

(71) Applicant: Xilinx, Inc., San Jose, CA (US)

(72) Inventors: Prathamesh M. Khatavkar, Dublin (IE); John K. Jennings, Glenageary (IE); Alonso Morgado, Zurich (CH)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/396,257

(22) Filed: Apr. 26, 2019

(51) Int. Cl.
*H03M 1/12* (2006.01)
*H03M 1/46* (2006.01)
*H03K 5/24* (2006.01)
*H01L 29/94* (2006.01)
*H03H 19/00* (2006.01)
*H01L 49/02* (2006.01)

(52) U.S. Cl.
CPC ............ *H03M 1/466* (2013.01); *H01L 28/60* (2013.01); *H01L 29/94* (2013.01); *H03H 19/004* (2013.01); *H03K 5/249* (2013.01); *H03K 5/2481* (2013.01)

(58) Field of Classification Search
CPC ...... H03M 1/04; H03M 1/506; H03M 1/0617; H03M 1/468; H03M 1/442; H03M 1/002; H03M 1/1245; H03M 1/08; H03M 1/164; H03M 1/167; H03M 1/203; H03M 1/403; H03M 1/466; H01L 28/60; H01L 29/94; H03H 19/004; H03K 5/2481; H03K 5/249
USPC ........ 341/172, 143, 155, 164, 165, 169, 170
See application file for complete search history.

(56) References Cited

U.S. PATENT DOCUMENTS

| | | | | |
|---|---|---|---|---|
| 5,461,381 A | * | 10/1995 | Seaberg | H03M 3/37 341/143 |
| 5,606,320 A | * | 2/1997 | Kleks | H03M 1/002 341/118 |
| 6,064,871 A | * | 5/2000 | Leung | H03M 3/39 341/77 |

(Continued)

OTHER PUBLICATIONS

Chun-Cheng Liu, et al., a 10-bit 50-MS/s SAR ADC with a monotonic capacitor switching procedure, IEEE Journal of Solid-State Circuits, vol. 45, No. 4, Apr. 2010, pp. 731-740.
Heena Parveen, et al., Implementation of low power adiabatic based Inverter for Dynamic Comparator, International Journal of Science and Research (IJSR) ISSN (Online):pp. 2320-2323, Bhilai, India, 2015.

(Continued)

*Primary Examiner* — Linh V Nguyen
(74) *Attorney, Agent, or Firm* — Craige Thompson, Thompson Patent Law

(57) ABSTRACT

Apparatus and associated methods relate to a circuit that is configured to keep a comparator input voltage stable. In an illustrative example, the circuit may include a first differential path coupled to a first switched-capacitor network's output, a second differential path coupled to a second switched-capacitor network's output. A comparator may have a first input coupled to the first differential path and a second input coupled to the second differential path. The comparator may be controlled by a clock signal to perform comparison. A first capacitor may be coupled from the clock signal to the first differential signal path and a second capacitor may be coupled from the clock signal to the second differential signal path. By introducing the first capacitor and the second capacitor, the comparator input common-mode may keep stable, and the comparator may be less sensitive to kickback effects.

14 Claims, 9 Drawing Sheets

(56) References Cited

U.S. PATENT DOCUMENTS

| | | | | |
|---|---|---|---|---|
| 6,531,907 | B2* | 3/2003 | Dooley | A61N 1/3704 327/307 |
| 6,937,174 | B2 | 8/2005 | Higashi et al. | |
| 8,471,755 | B1* | 6/2013 | Figueiredo | H03M 1/468 341/155 |
| 8,933,830 | B1* | 1/2015 | Jeon | H03M 1/1071 341/110 |
| 2001/0007443 | A1* | 7/2001 | Ono | H03F 1/086 341/159 |
| 2012/0001781 | A1* | 1/2012 | Scanlan | H03M 1/1004 341/110 |
| 2012/0280841 | A1 | 11/2012 | Wang et al. | |
| 2014/0375374 | A1* | 12/2014 | Nervegna | G01N 27/26 327/337 |
| 2018/0175875 | A1* | 6/2018 | Tsai | H03M 1/0626 |
| 2018/0226981 | A1* | 8/2018 | Salem | H03M 1/462 |

OTHER PUBLICATIONS

Pedro W Figueiredo, et al., Kickback Noise Reduction Techniques for CMOS Latched Comparators, IEEE Transactions on Circuits and Systems-II: Express Briefs, vol. 53, No. 7, Jul. 2006, pp. 541-545.

Geert Van Der Plas, A 0.16pJ/Conversion-Step 2.5mW 1.25GS/s 4b ADC in a 90nm Digital CMOS Process, ISSCC 2006 / Session 31 / Very High-Speed ADCs and DACs / 31.1, 10 pages, Feb. 8, 2006, Leuven, Belgium.

Daniel Schinkel, et al., A Double-Tail Latch-Type Voltage Sense Amplifier with 18ps Setup+Hold Time, ISSCC 2007 / Session 17 / Analog Techniques and PLLs /17.7, Digest of Technical Papers, pp. 314-315; 605, Enschede, Netherlands, 2007.

Behzad Razavi, The Flash ADC, A Circuit for All Seasons, IEEE Solid-State Circuits Magazine, pp. 9-13, Aug. 25, 2017.

* cited by examiner

| SCHEME | COMMON-MODE KICK-BACK (mV) | DIFFERENTIAL KICK-BACK (mV) | TIME RESPONSE (ps) |
|---|---|---|---|
| No adjustment circuit | 425 | 30 | 1000 |
| Adjustment circuit having Cc | 395 | 28 | 380 |
| Adjustment circuit having both Cc and Cp | 145 | 1.77 | 300 |

CAPACITOR-ENHANCED COMPARATOR FOR SWITCHED-CAPACITOR (SC) CIRCUITS WITH REDUCED KICKBACK

TECHNICAL FIELD

Various embodiments relate generally to comparators.

BACKGROUND

Data represents information that has useful value. Data can take the form of stored information. Data storage can be in analog form. Data storage can also be in digital form.

Data can also be in digital format communicated between two nodes. When data is communicated, for example, it can be received and interpreted as a function of time. Some systems that receive communicated digitally-formatted data are based on a clock that determines when a voltage signal is sampled to decide whether a symbol in a data stream is, for example, a one or a zero. Sometimes, data is received without knowing its specific phase information. Phase alignments are performed before launching data or receiving data to ensure data accuracy and data integrity. An analog-to-digital converter (ADC) converts analog signals into digital signals. A digital-to-analog converter converts digital signals into analog signals.

SUMMARY

Apparatus and associated methods relate to a circuit that is configured to keep a comparator input voltage stable. In an illustrative example, the circuit may include a first differential path coupled to a first switched-capacitor network's output, a second differential path coupled to a second switched-capacitor network's output. A comparator may have a first input ($IN_p$) coupled to the first differential path and a second input ($IN_n$) coupled to the second differential path. The comparator may be controlled by a clock signal to perform comparison. A first capacitor may be coupled from the clock signal to the first differential signal path and a second capacitor may be coupled from the clock signal to the second differential signal path. By introducing the first capacitor and the second capacitor, the comparator input common-mode may keep stable, and the comparator may be less sensitive to kickback effects.

Various embodiments may achieve one or more advantages. For example, some embodiments may improve the comparator's performance and enable the comparator to provide a decision at a required time. Some embodiments may provide a capacitive path to compensate for the kickback voltage in an opposite direction to the kickback voltage by introducing a first capacitor $C_{c1}$ and a second capacitor $C_{c2}$. Some embodiments may attenuate kickback in a switched-capacitor (SC) network preceding the comparator by introducing a third capacitor $C_{p1}$ and a fourth capacitor $C_{p1}$. Some embodiments may also reduce the input offset of the comparator. In various embodiments, the comparator input common-mode may keep stable, and the comparator may be less sensitive to kickback effects. In some embodiments, the capacitor may be N-channel metal-oxide-semiconductor field-effect transistor (NMOSFET) capacitor, which may lead to a lower effective loading to a clock signal and thus lead to a faster comparator response. In some embodiments, by arranging the adjustment circuit between the SC network and the comparator, the SC network may be directly connected to the comparator with minimal degradation in the comparator operation, which may result in low power and area by effectively removing the need for an active preamplifier in the comparator.

Some embodiments may be flexibly employed, for example, in programmable logic, such as a field programmable gate array (FPGA) that may permit the adjustment circuit to be reconfigurable to the field. In some embodiments, cost, size or power may be reduced, for example, when implemented on a fixed hardware platform, such as an application-specific integrated circuit (ASIC).

In one exemplary aspect, a circuit includes a first differential path coupled to an output of a first switched-capacitor network that is configured to receive a first differential input ($V_{inp}$). The circuit also includes a second differential path coupled to an output of a second switched-capacitor network that is configured to receive a second differential input ($V_{inn}$). The circuit also includes a comparator circuit having a first input ($IN_p$) coupled to the first differential path and a second input ($IN_n$) coupled to the second differential path. The comparator circuit is configured to enable comparison between the first differential path (265a) and the second differential path (265b) in response to a clock signal. A first capacitor ($C_{c1}$) is coupled from the clock signal to the first differential signal path. A second capacitor ($C_{c2}$) is coupled from the clock signal to the second differential signal path.

In some embodiments, the circuit may also include a third capacitor ($C_{p1}$) coupled from a common mode voltage ($V_{CM}$) of the comparator circuit to the first differential signal path. A fourth capacitor ($C_{p2}$) may be coupled from the common mode voltage ($V_{CM}$) of the comparator circuit to the second differential signal path. In some embodiments, the first differential path may include a first pre-amplifier circuit having an input coupled to the third capacitor, and an output coupled to the first capacitor ($C_{c1}$). The second differential path may include a second pre-amplifier circuit having an input coupled to the fourth capacitor ($C_{p2}$), and an output coupled to the second capacitor ($C_{c2}$).

In some embodiments, the third capacitor ($C_{p1}$) may be a metal-oxide-metal capacitor. The fourth capacitor ($C_{p2}$) may be a metal-oxide-metal capacitor. In some embodiments, the third capacitor ($C_{p1}$) may be a metal-insulator-metal (MIM) capacitor. The fourth capacitor ($C_{p2}$) may be a metal-insulator-metal (MIM) capacitor. In some embodiments, the first capacitor ($C_{c1}$) may be a metal-insulator-metal capacitor. The second capacitor ($C_{c2}$) may be a metal-insulator-metal capacitor.

In another exemplary aspect, an analog-to-digital converter (ADC) includes a first switched-capacitor network having an input configured to receive a first differential input ($V_{inp}$) and an output coupled to a first differential path. The ADC also includes a second switched-capacitor network having an input configured to receive a second differential input ($V_{inn}$) and an output coupled to a second differential path. The ADC also includes a comparator circuit having a first input ($IN_p$) coupled to an output of the first differential path and a second input ($IN_n$) coupled to an output of the second differential path. The comparator circuit is configured to enable comparison between the first differential path and the second differential path in response to a clock signal. The ADC also includes a first capacitor ($C_{c1}$) coupled from the clock signal to the first differential signal path. The ADC also includes a second capacitor ($C_{c2}$) coupled from the clock signal to the second differential signal path.

In some embodiments, the ADC may also include a third capacitor ($C_{p1}$) coupled from a common mode voltage ($V_{CM}$) of the comparator circuit to the first differential signal path, and, a fourth capacitor ($C_{p2}$) coupled from the common mode voltage ($V_{CM}$) of the comparator circuit to the second differential signal path. In some embodiments, the first differential path may include a first pre-amplifier having an input coupled to the third capacitor ($C_{p1}$), and an output coupled to the first capacitor ($C_{c1}$), and, the second differential path may also include a second pre-amplifier having an input coupled to the fourth capacitor ($C_{p2}$), and an output coupled to the second capacitor ($C_{c2}$). In some embodiments, the third capacitor ($C_{p1}$) may be a metal-oxide-metal capacitor. In some embodiments, the fourth capacitor ($C_{p2}$) may be a metal-oxide-metal capacitor. In some embodiments, the ADC may be a successive approximation register (SAR) ADC.

In another exemplary aspect, a method includes providing a first differential path, the first differential path is coupled to an output of a first switched-capacitor network that is configured to receive a first differential input ($V_{inp}$). The method also includes providing a second differential path, the second differential path is coupled to an output of a second switched-capacitor network that is configured to receive a second differential input ($V_{inn}$). The method also includes providing a comparator circuit with a first input ($IN_p$) coupled to the first differential path and a second input ($IN_n$) coupled to the second differential path, the comparator circuit is configured to enable comparison between the first differential path and the second differential path in response to a clock signal. The method also includes providing a first capacitor ($C_{c1}$), the first capacitor ($C_{c1}$) is coupled from the clock signal to the first differential signal path. The method also includes providing a second capacitor ($C_{c2}$), the second capacitor ($C_{c2}$) is coupled from the clock signal to the second differential signal path.

In some embodiments, the method may also include coupling a third capacitor ($C_{p1}$) from a common mode voltage ($V_{CM}$) of the comparator circuit to the first differential signal path, and, coupling a fourth capacitor ($C_{p2}$) from the common mode voltage ($V_{CM}$) of the comparator circuit to the second differential signal path. In some embodiments, the method may also include providing a first pre-amplifier circuit with an input coupled to the third capacitor ($C_{p1}$), and an output coupled to the first capacitor ($C_{c1}$), and, providing a second pre-amplifier circuit with an input coupled to the fourth capacitor ($C_{p2}$), and an output coupled to the second capacitor ($C_{c2}$). In some embodiments, the third capacitor (Cp1) may be a metal-oxide-metal capacitor. In some embodiments, the fourth capacitor (Cp2) may be a metal-oxide-metal capacitor.

The details of various embodiments are set forth in the accompanying drawings and the description below. Other features and advantages will be apparent from the description and drawings, and from the claims.

BRIEF DESCRIPTION OF THE DRAWINGS

FIG. 7B depicts experimental results of the comparison of different embodiments of exemplary adjustment circuits.

Like reference symbols in the various drawings indicate like elements.

DETAILED DESCRIPTION OF ILLUSTRATIVE EMBODIMENTS

To aid understanding, this document is organized as follows. First, an exemplary platform (e.g., FPGA) of an analog-to-digital converter (ADC) is briefly introduced with reference to FIG. 1. Second, with reference to FIGS. 2-6, the discussion turns to introduce how exemplary adjustment circuits may be used in an ADC to reduce the kickback effect. Finally, with reference to FIGS. 7A and 7B, the discussion turns to disclose exemplary experimental results and simulation results illustrate reduced kickback effects in an exemplary circuit. In some embodiments of the adjustment circuit, an active preamplifier may optimally be removed between a switched-capacitor (SC) network and a comparator, the SC network may be directly connected to the comparator with substantially reduced or no degradation in comparator operation.

Figure 1:
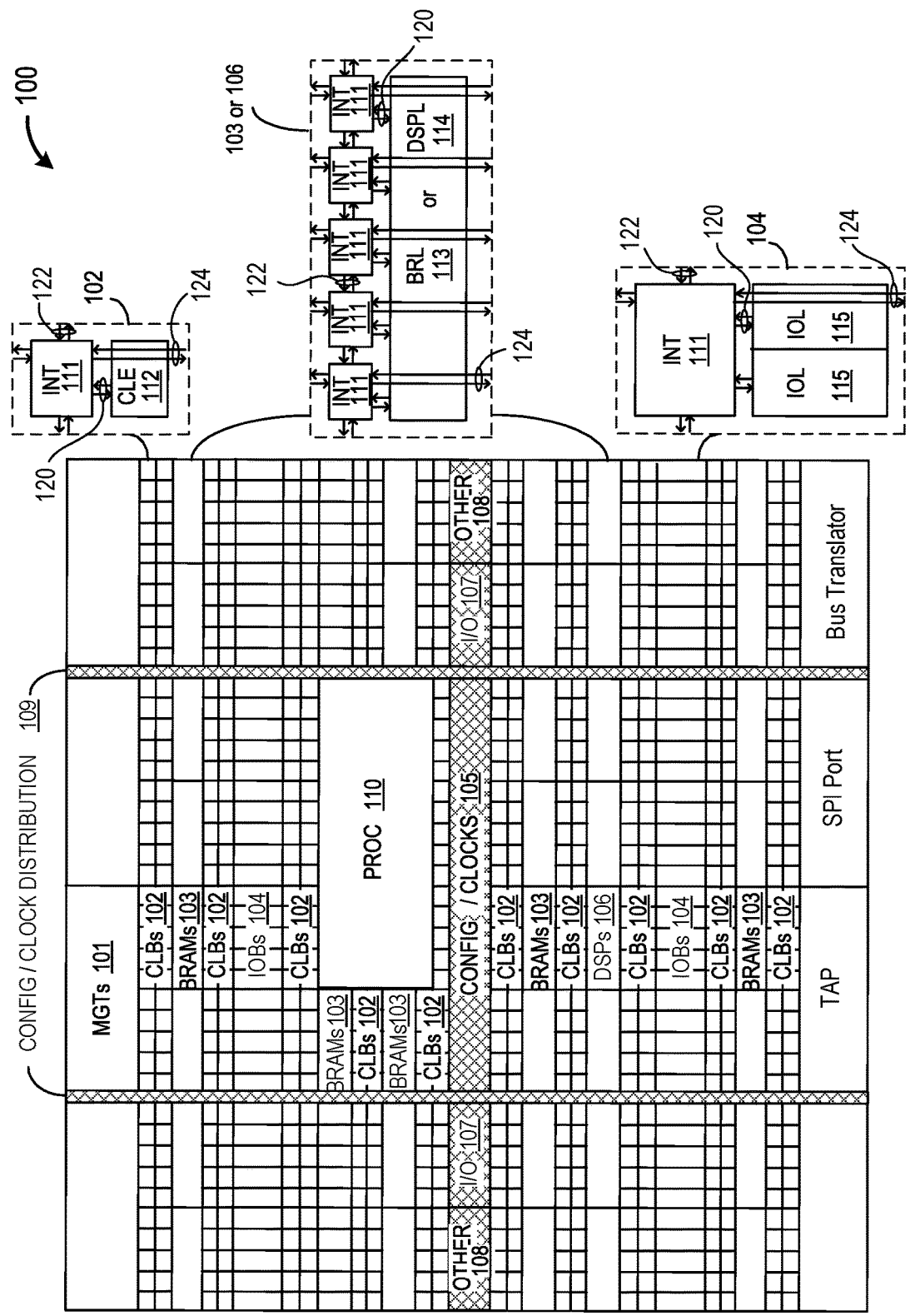
FIG. 1 depicts an exemplary programmable integrated circuit (IC) on which the disclosed circuits and processes may be implemented.

FIG. 1 depicts an exemplary programmable integrated circuit (IC) on which the disclosed circuits and processes may be implemented. A programmable IC 100 includes a Field Programmable Gate Array (FPGA) logic. The programmable IC 100 may be implemented with various programmable resources and may be referred to as a System on Chip (SOC). Various examples of FPGA logic may include several diverse types of programmable logic blocks in an array.

For example, FIG. 1 illustrates a programmable IC 100 that includes a large number of different programmable tiles including multi-gigabit transceivers (MGTs) 101, configurable logic blocks (CLBs) 102, blocks of random access memory (BRAMs) 103, input/output blocks (IOBs) 104, configuration and clocking logic (CONFIG/CLOCKS) 105, digital signal processing blocks (DSPs) 106, specialized input/output blocks (I/O) 107 (e.g., clock ports), and other programmable logic 108 (e.g., digital clock managers, analog-to-digital converters, system monitoring logic). The programmable IC 100 includes dedicated processor blocks (PROC) 110. The programmable IC 100 may include internal and external reconfiguration ports (not shown).

In various examples, a serializer/deserializer may be implemented using the MGTs 101. The MGTs 101 may include various data serializers and deserializers. Data serializers may include various multiplexer implementations. Data deserializers may include various demultiplexer implementations.

In some examples of FPGA logic, each programmable tile includes a programmable interconnect element (INT) 111 having standardized inter-connections 124 to and from a corresponding interconnect element in each adjacent tile.

Therefore, the programmable interconnect elements taken together implement the programmable interconnect structure for the illustrated FPGA logic. The programmable interconnect element INT 111 includes the intra-connections 120 to and from the programmable logic element within the same tile, as shown by the examples included in FIG. 1. The programmable interconnect element INT 111 includes the inter-INT-connections 122 to and from the programmable interconnect element INT 111 within the same tile, as shown by the examples included in FIG. 1.

For example, a CLB 102 may include a configurable logic element (CLE) 112 that may be programmed to implement user logic, plus a single programmable interconnect element INT 111. A BRAM 103 may include a BRAM logic element (BRL) 113 and one or more programmable interconnect elements. In some examples, the number of interconnect elements included in a tile may depend on the height of the tile. In the pictured implementation, a BRAM tile has the same height as five CLBs, but other numbers (e.g., four) may also be used. A DSP tile 106 may include a DSP logic element (DSPL) 114 and one or more programmable interconnect elements. An IOB 104 may include, for example, two instances of an input/output logic element (IOL) 115 and one instance of the programmable interconnect element INT 111. The actual I/O bond pads connected, for example, to the I/O logic element 115, may be manufactured using metal layered above the various illustrated logic blocks, and may not be confined to the area of the input/output logic element 115.

In the pictured implementation, a columnar area near the center of the die (shown shaded in FIG. 1) is used for configuration, clock, and other control logic. Horizontal areas 109 extending from the column distribute the clocks and configuration signals across the breadth of the programmable IC 100. Note that the references to "columnar" and "horizontal" areas are relative to viewing the drawing in a portrait orientation.

Some programmable ICs utilizing the architecture illustrated in FIG. 1 may include additional logic blocks that disrupt the regular columnar structure making up a large part of the programmable IC. The additional logic blocks may be programmable blocks and/or dedicated logic. For example, the processor block PROC 110 shown in FIG. 1 spans several columns of CLBs 102 and BRAMs 103.

FIG. 1 illustrates an exemplary programmable IC architecture. The numbers of logic blocks in a column, the relative widths of the columns, the number and order of columns, the types of logic blocks included in the columns, the relative sizes of the logic blocks, and the interconnect/logic implementations are provided purely as examples. For example, in an actual programmable IC, more than one adjacent column of CLBs 102 may be included wherever the CLBs 102 appear, to facilitate the efficient implementation of user logic.

At least one transceiver may be embedded in the FPGA or an ASIC to perform data transmitting and data receiving during communication. Transceiver may include one or more ADCs to perform analog-to-digital conversions. ADCs may be used in many applications, for example, communication systems. Comparators are key components in ADCs and many other systems. Decision operations of comparators may result in very large output voltages with very fast transitions, which may lead to undesirable kickback noise. A drop of the comparator input common-mode voltages may result in the comparator not being able to properly perform a comparison or comparing very slowly. By using an adjustment circuit, the comparator input common-mode voltages may advantageously be kept substantially stable.

Figure 2:
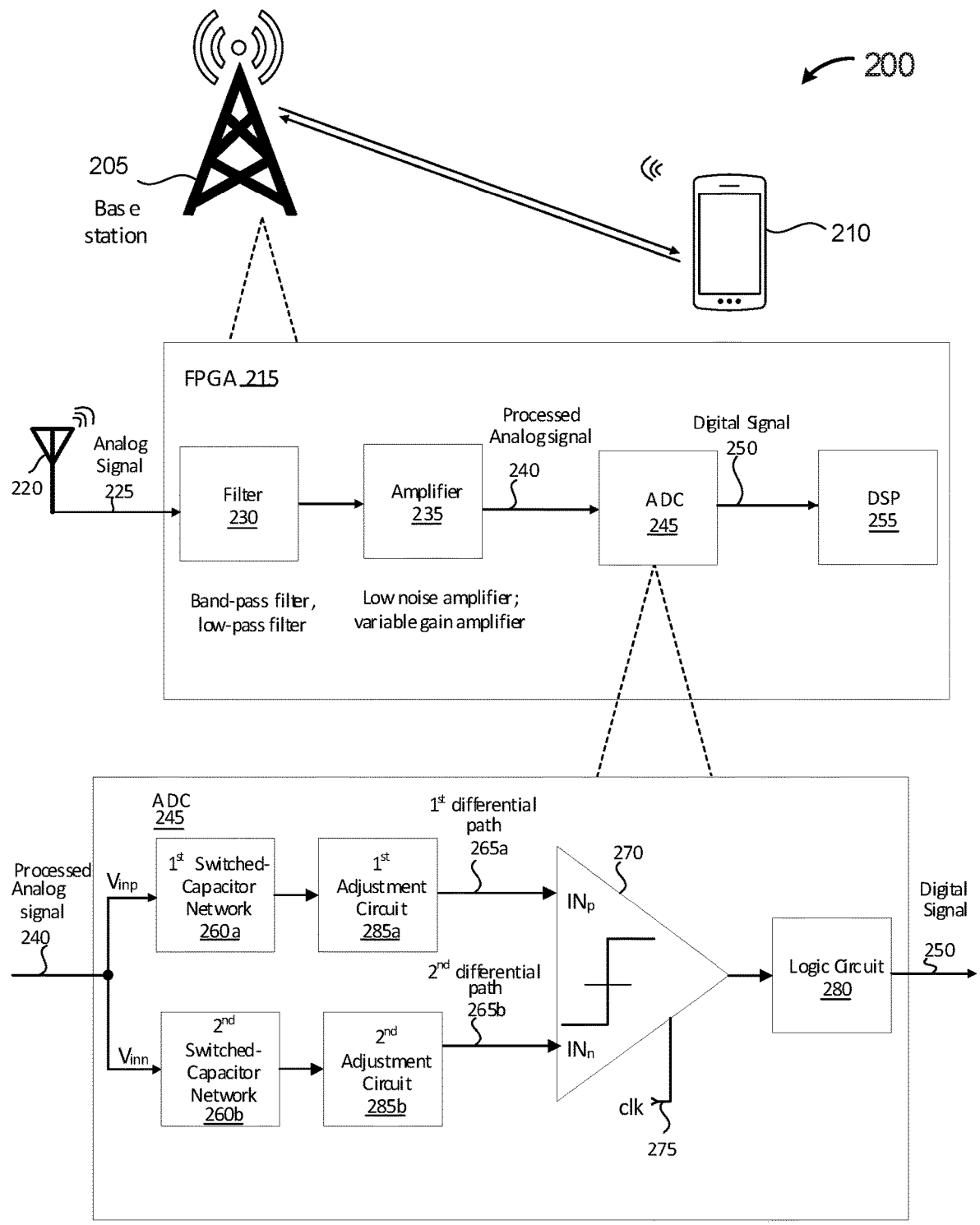
FIG. 2 depicts a part of an exemplary ADC with an adjustment circuit implemented in a communication system.

FIG. 2 depicts a part of an exemplary ADC with an adjustment circuit implemented in a communication system. A communication system 200 includes a base station 205. The base station 205 may be used to transmit and receive data from some data communication devices. In this exemplary example, the base station 205 receives analog signals from a cell phone 210. The base station 205 includes an FPGA 215 to perform data communication through an antenna 220 between the base station 205 and the cell phone 210. The antenna 220 transfers a received analog signal 225 to a filter (e.g., band-pass filter, low-pass filter) 230. The filter 230 filters errors and/or noises in the analog signal 225. The filtered analog signal is amplified by an amplifier (e.g., low noise amplifier, variable gain amplifier) 235 to generate a processed analog signal 240. The processed analog signal 240 is converted to a digital signal 250 through an analog-to-digital converter (ADC) 245. The digital signal 250 is then processed by a digital signal processor (DSP) 255, for example.

In this depicted example, only components around a comparator within the ADC 245 is presented. The ADC 245 includes a first switched-capacitor (SC) passive network 260a and a second switched-capacitor (SC) passive network 260b. The first and second SC passive network 260a, 260b may include switches and capacitors configured to sample and hold a pair of input voltages $V_{inp}$ and $V_{inn}$, with respect to a common mode bias voltage $V_{cm}$, for example. The first switched-capacitor network 260a has an output coupled to a first differential path 265a. The first differential path 265a connects the first switched-capacitor (SC) passive network 260a to a first input ($IN_p$) of a comparator 270. The second switched-capacitor network 260b has an output coupled to a second differential path 265b. The second differential path 265b connects the second switched-capacitor (SC) passive network 260b to a second input ($IN_n$) of the comparator 270. In this depicted example, the comparator 270 may be a standard regenerative latch preceded by a dynamic amplifier. The comparator 270 is configured to compare the first differential path 265a and the second differential path 265b in response to a clock signal 275. The ADC 245 also includes a logic circuit 280. The logic circuit 280 receives a comparison result from the comparator 270 and generates the digital signal 250.

The ADC 245 also includes a first adjustment circuit 285a and a second adjustment circuit 285b. The adjustment circuit 285a, 285b may keep the comparator input common-mode stable and allow the switched-capacitor passive network 260a, 260b to be directly connected to the comparator 270 with low or no degradation in the comparator operation. By using the adjustment circuit 285a, 285b, there is no need to use an active preamplifier in the comparator 270, which may advantageously reduce power consumption and area of the ADC. An example of an adjustment circuit is described in further detail with reference to FIG. 3A.

Although, in this depicted example, the ADC 245 is implemented in programmable logic (e.g., the FPGA 215). In some other embodiments, a custom ASIC with dedicated hardware circuits may be configured to perform one or more of the exemplary ADC functions. For example, an ASIC with custom fixed hardware circuits may be designed to function as one or more parts of the ADC 245 that are capable of efficiently converting analog signals into digital signals. In some embodiments, the SC passive network 260a, 260b, the comparator 270, the logic circuit 280, and/or the adjustment circuit 285a, 285b may be implemented in the programmable logic, and the comparator 270 may be implemented in a fixed (e.g., hard block) circuitry of a system-on-chip (SoC).

In some embodiments, the adjustment circuit 285a, 285b may be arranged on the same programmable logic (e.g., FPGA 215) with the comparator 270. In some embodiments, the adjustment circuit 285a, 285b may be implemented in a different programmable logic (e.g., another FPGA) from the comparator 270 to compensate the kickback noise. In some embodiments, the adjustment circuit 285a, 285b may be arranged off-chip, for example, using discrete capacitors.

In some embodiments, the adjustment circuit 285a, 285b may be implemented as hard block fixed circuitry. For example, an application specific integrated circuit (ASIC) may provide an adjustment circuit for advantageously keeping the comparator common-mode input stable.

In some embodiments, some or all of the functions of the ADC may be implemented in a programmable logic block of a system-on-chip (SoC) or implemented in the same or different hard blocks using fixed circuitry of the SoC.

Figure 3A:
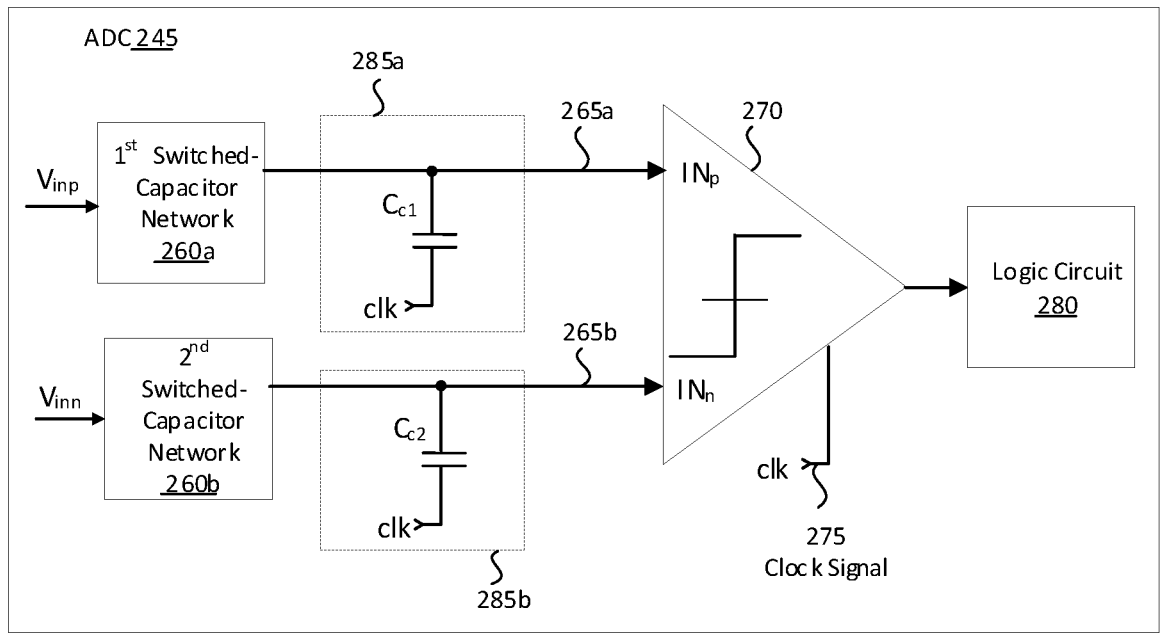
FIG. 3A depicts an architecture of an exemplary adjustment circuit.

FIG. 3A depicts an architecture of an exemplary adjustment circuit. In this depicted example, the first adjustment circuit 285a is implemented between the first SC network 260a and the first input $IN_p$ of the comparator 270, and a second adjustment circuit 285b is implemented between the second SC network 260b and the second input $IN_n$ of the comparator 270.

More specifically, the first adjustment circuit 285a includes a first capacitor $C_{c1}$. One terminal of the $C_{c1}$ is coupled to the first differential path 265a, and the other terminal of the first capacitor $C_{c1}$ is controlled by the clock signal 275. The second adjustment circuit 285b includes a second capacitor $C_{c2}$. One terminal of the $C_{c2}$ is coupled to the second differential path 265b, and the other terminal of the second capacitor $C_{c2}$ is controlled by the clock signal 275. The first capacitor $C_{c1}$ and the second capacitor $C_{c2}$ may function as dynamic capacitors and introduce a path to counteract the effect of a common-mode kickback voltage by injecting charge in the opposite direction to the original kickback as the comparison clock toggles.

Figure 3B:
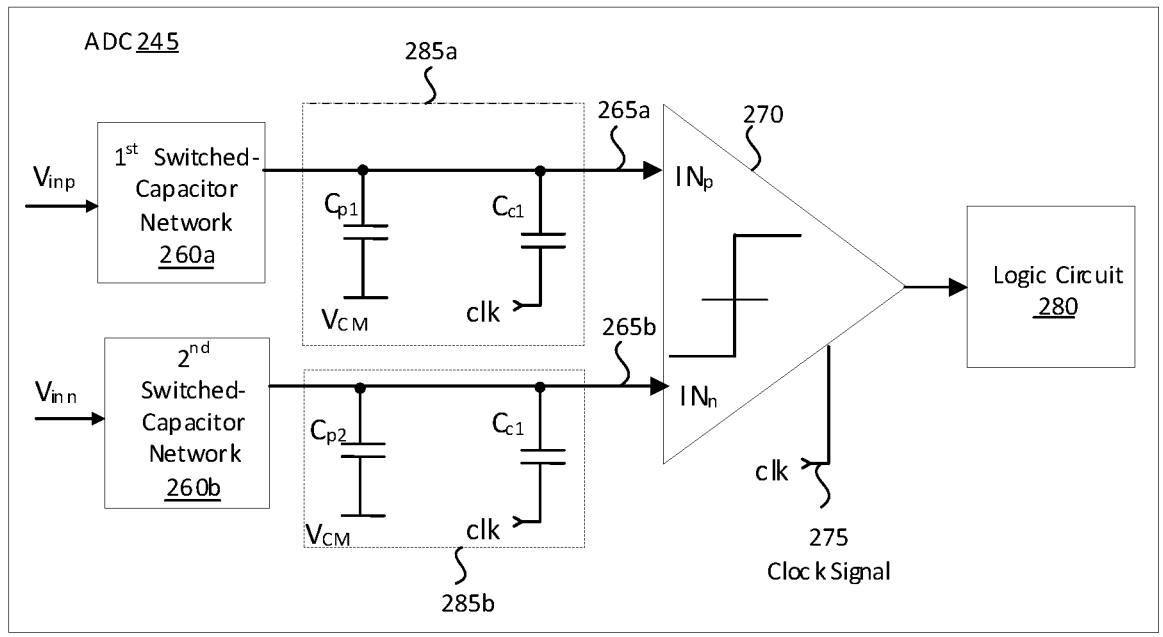
FIG. 3B depicts another architecture of an exemplary adjustment circuit.

FIG. 3B depicts another architecture of an exemplary adjustment circuit. In this depicted example, the first adjustment circuit 285a is implemented between the first SC network 260a and the first input $IN_p$ of the comparator 270, and a second adjustment circuit 285b is implemented between the second SC network 260b and the second input $IN_n$ of the comparator 270.

More specifically, the first adjustment circuit 285a includes a first capacitor $C_{c1}$. One terminal of the $C_{c1}$ is coupled to the first differential path 265a, and the other terminal of the first capacitor $C_{c1}$ is controlled by the clock signal 275. The first adjustment circuit 285a also includes a third capacitor $C_{p1}$. One terminal of the $C_{p1}$ is coupled to the first differential path 265a, and the other terminal of the third capacitor $C_{p1}$ is controlled by the common mode voltage $V_{CM}$ of the comparator 270.

The second adjustment circuit 285b includes a second capacitor $C_{c2}$. One terminal of the $C_{c2}$ is coupled to the second differential path 265b, and the other terminal of the second capacitor $C_{c2}$ is controlled by the clock signal 275. The second adjustment circuit 285b also includes a fourth capacitor $C_{p2}$. One terminal of the $C_{p2}$ is coupled to the second differential path 265b, and the other terminal of the fourth capacitor $C_{p2}$ is controlled by the common mode voltage $V_{CM}$ of the comparator 270.

The first capacitor $C_{c1}$ and the second capacitor $C_{c2}$ may function as dynamic capacitors and introduce a path to counteract the effect of a common-mode kickback voltage by injecting charge in the opposite direction to the original kickback as the comparison clock toggles. The third capacitor $C_{p1}$ and the fourth capacitor $C_{p2}$ may function as decoupling capacitors to reduce a common-mode kickback voltage at conversion time. By introducing third capacitor $C_{p1}$ and the fourth capacitor $C_{p2}$, the comparator input disturbances on the comparison may be advantageously reduced.

In some embodiments, the capacitor $C_{c1}$ and $C_{c2}$ may be N-channel metal-oxide-semiconductor field-effect transistor (NMOSFET) capacitors that may lead to a lower effective loading to the clock signal 275 and thus lead to a faster comparator response. In some embodiments, the capacitor $C_{p1}$ and $C_{p2}$ may be metal-oxide-metal (MOM) capacitors, for example. The capacitor $C_{c1}$ and $C_{c2}$ may be metal-insulator-metal (MIM) capacitors, for example. In some embodiments, the capacitor $C_{p1}$ may include one or more sub-capacitors. In some embodiments, the capacitor $C_{c1}$ may include one or more sub-capacitors.

Figure 3C:
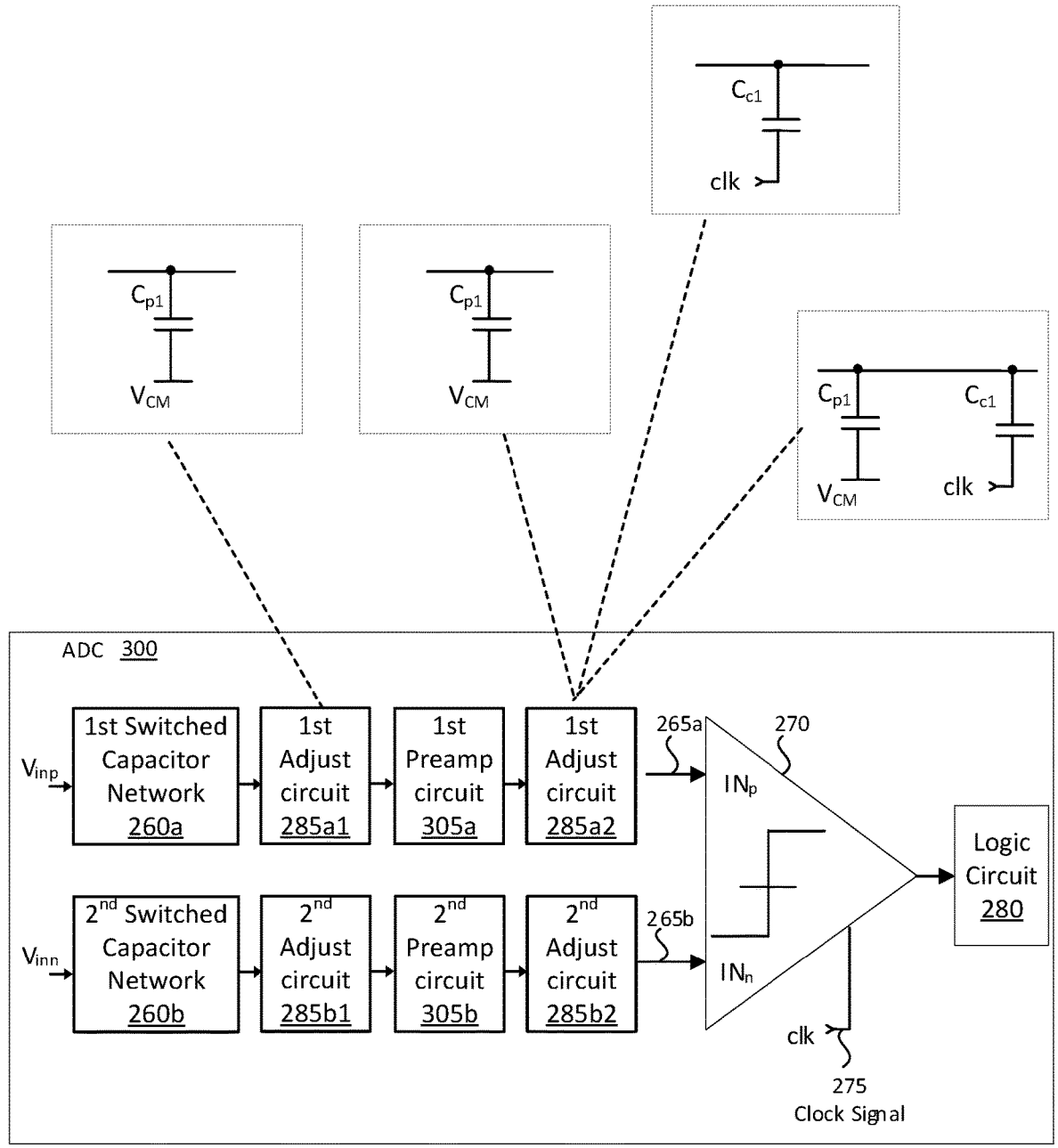
FIG. 3C depicts an arrangement of a preamplifier circuit in an exemplary ADC.

FIG. 3C depicts an arrangement of a preamplifier circuit in an exemplary ADC. An ADC (e.g., ADC 300) may include a preamplifier and one or more adjustment circuits. Preamplifier circuits may be used to further reduce kickback noise. In this depicted example, a first preamplifier circuit 305a is arranged between two adjustment circuits. For example, the preamplifier circuit 305a is arranged between an adjustment circuit $285a_1$ and an adjustment circuit $285a_2$. A second preamplifier circuit 305b is also arranged between two adjustment circuits (e.g., an adjustment circuit $285b_1$ an adjustment circuit $285b_2$). In some embodiments, the adjustment circuit $285a_1$ and the adjustment circuit $285b_1$ may include a capacitor $C_{p1}$ to attenuate kickback. In some embodiments, the adjustment circuit $285a_2$ and the adjustment circuit $285b_2$ may include a capacitor $C_{p1}$ to attenuate kickback noise. In some embodiments, the adjustment circuit $285a_2$ and the adjustment circuit $285b_2$ may also be the adjustment circuit described in FIG. 3A. In some embodiments, the adjustment circuit $285a_2$ and the adjustment circuit $285b_2$ may also be the adjustment circuit described in FIG. 3B. In some embodiments, the capacitor of $C_{p1}$ in the adjustment circuit $285a_1$ may be different from the capacitor of $C_{p1}$ in the adjustment $285a_2$. By introducing the preamplifier circuit 305a, 305b and the one or more adjustment circuits, the kickback noise may advantageously be further decreased.

Figure 4:
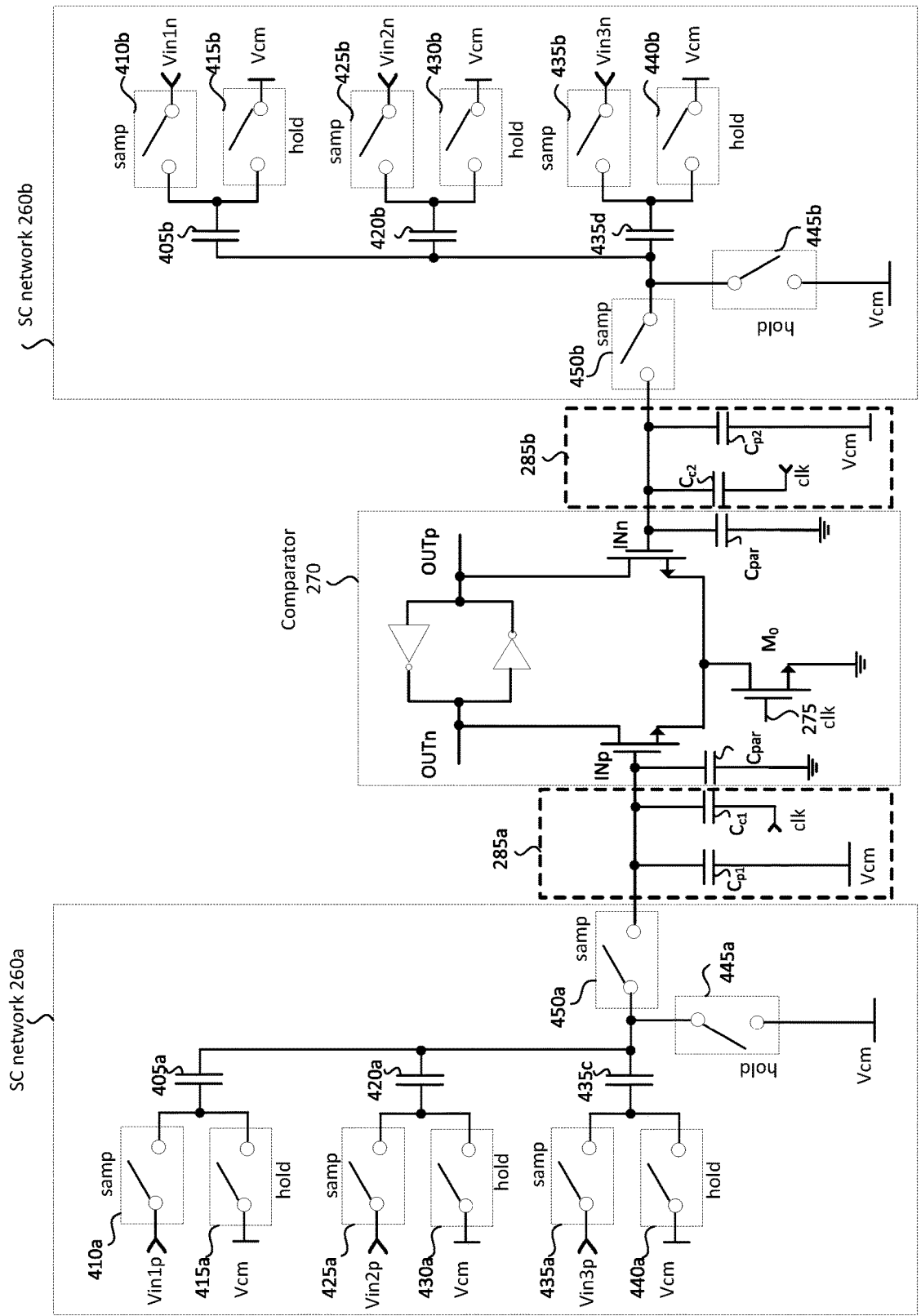
FIG. 4 depicts an exemplary adjustment circuit implemented around an SC adder and a dynamic comparator in a successive approximation register (SAR) ADC.

FIG. 4 depicts an exemplary adjustment circuit implemented around an SC adder and a dynamic comparator in a successive approximation register (SAR) ADC. In this depicted example, the switched-capacitor (SC) network 260a, 260b are arranged in the signal flow before the comparator 270 (e.g., a dynamic comparator). The first SC network 260a is connected to the first input $IN_p$ of the comparator 270 and the second SC network 260b is connected to the second input $IN_n$ of the comparator 270. In some embodiments, the first SC network 260a and the second SC network 260b may be arranged off-chip.

The first SC network 260a includes a first set of sampling capacitors (e.g., capacitors 405a, 420a, 435c) connected through a first set of switches (e.g., 410a, 425a, 435a) to a corresponding input voltage (e.g., $V_{in1p}$, $V_{in2p}$, $V_{in3p}$). The first set of sampling capacitors (e.g., capacitors 405a, 420a, 435c) are also connected through a second set of switches (e.g., 415a, 430a, 440a) to the comparator input common-mode voltage $V_{cm}$. The first set of sampling capacitors are connected to the first differential path 265a and then to the first input $IN_p$ of the comparator 270 as a summing junction. The first SC network 260a also includes a first holding switch 445a with one terminal connected to the first set of sampling capacitors (e.g., capacitors 405a, 420a, 435c) and the other terminal connected to the capacitor input common-mode voltage $V_{cm}$. The first SC network 260a also includes a first sampling switch 450a with one terminal connected to the first set of sampling capacitors (e.g., capacitors 405a, 420a, 435c) and the other terminal connected to the first differential path 265a.

The second part SC 250b includes a second set of sampling capacitors (e.g., capacitors 405b, 420b, 435d) connected through a third set of switches (e.g., 410b, 425b, 435b) to a corresponding input voltage (e.g., $V_{in1n}$, $V_{in2n}$, $V_{in3n}$). The second set of sampling capacitors (e.g., capacitors 405b, 420b, 435d) are also connected through fourth set of switches (e.g., 415b, 430b, 440b) to the comparator input common-mode voltage $V_{cm}$. The second set of sampling capacitors are connected to the second input $IN_n$ of the comparator 270 as a summing junction through the second differential path 265b. The second part SC 250b also includes a second holding switch 445b with one terminal connected to the second set of sampling capacitors (e.g., capacitors 405b, 420b, 435d) and the other terminal connected to the comparator input common-mode voltage $V_{cm}$. The second part SC 250b also includes a second sampling switch 450b with one terminal connected to the second set of sampling capacitors (e.g., capacitors 405b, 420b, 435d) and the other terminal connected to the second differential path 265b. In some embodiments, the capacitors 405a, 420a, 435c and capacitors 405b, 420b, 435d may be metal-oxide-metal (MOM) capacitors, or metal-insulator-metal (MIM) capacitors, for example.

The first set of switches (e.g., 410a, 425a, 435a), the second set of switches (e.g., 415a, 430a, 440a), the third set of switches (e.g., 410b, 425b, 435b), the fourth set of switches (e.g., 415b, 430b, 440b), the holding switches (e.g., 445a, 445b), and/or the sampling switches (450a, 450b) may be controlled by controlling signals to sample and/or hold the corresponding input voltages (e.g., $V_{in1p}$, $V_{in2p}$, $V_{in3p}$, $V_{in1n}$, $V_{in2n}$, $V_{in3n}$). For example, in a sampling state, the first set of switches (e.g., 410a, 425a, 435a), the third set of switches (e.g., 410b, 425b, 435b), and the sampling switches (450a, 450b) may be closed, and other switches may be open. In a holding state, the second set of switches (e.g., 415a, 430a, 440a), the fourth set of switches (e.g., 415b, 430b, 440b), and the holding switches (e.g., 445a, 445b) may be closed, and other switches may be open.

In this depicted example, the comparator 270 is a dynamic comparator. The dynamic comparator 270 may have two operating modes: reset mode and evaluation mode. These operating modes may operate as per the clock input (e.g., clock signal 275) that is provided to the comparator 270. When clock input is LOW in reset phase, transistor $M_0$ may be in OFF state. During the evaluation phase, when the clock input (e.g., clock signal 275) becomes HIGH, the transistor $M_0$ may be ON. Thus, $Out_n$ and $Out_p$ may start falling with different rates of discharging. When $IN_p$ is greater than $IN_n$, the voltage at $Out_p$ may discharge slower than that of $Out_n$.

In this depicted example, the parasitic capacitor $C_{par}$ of the transistor $M_0$ is also shown. The parasitic capacitor $C_{par}$ is used to account for wiring parasitic and the comparator 270 input parasitic capacitor. The adjustment circuit 285a, 285b are arranged between the SC 260a, 260b and the comparator 270. The first adjustment circuit 285a is implemented between the first SC network 260a and the first input $IN_p$ of the comparator 270, and a second adjustment circuit 285b is implemented between the second SC network 260b and the input $IN_n$ of the comparator 270.

In this depicted example, the adjustment circuit 285a, 285b have the same adjustment circuit structure as shown in FIG. 3B. In another embodiment, the adjustment circuit 285a, 285b may have the same adjustment circuit structure as shown in FIG. 3A. In some embodiments, the capacitor $C_{c1}$ and $C_{c2}$ may be N-channel metal-oxide-semiconductor field-effect transistor (NMOSFET) capacitors that may lead to a lower effective loading to the clock signal 275 and thus lead to a faster comparator response. In one exemplary embodiment, the capacitor $C_{p1}$, $C_{p2}$ may be about 50 fF, the capacitors 405a, 405b may be about 100 fF, the capacitors 420a, 420b may be about 400 fF and the capacitors 435c, 435d may be about 800 fF, for example. In some embodiments, the capacitor $C_{p1}$ and $C_{p2}$ may be metal-oxide-metal (MOM) capacitors, for example. The capacitor $C_{c1}$ and $C_{c2}$ may be metal-insulator-metal (MIM) capacitors, for example.

The capacitor $C_{p1}$ and $C_{p2}$ may function as decoupling capacitors. By introducing the capacitor $C_{p1}$ and $C_{p2}$, the comparator input disturbances on the comparison may be advantageously reduced. The capacitor $C_{c1}$ and $C_{c2}$ may function as dynamic capacitors and introduce a path to counteract the effect of a common-mode kickback voltage by injecting charge in the opposite direction to the original kickback as the comparison clock toggles.

Figure 5:
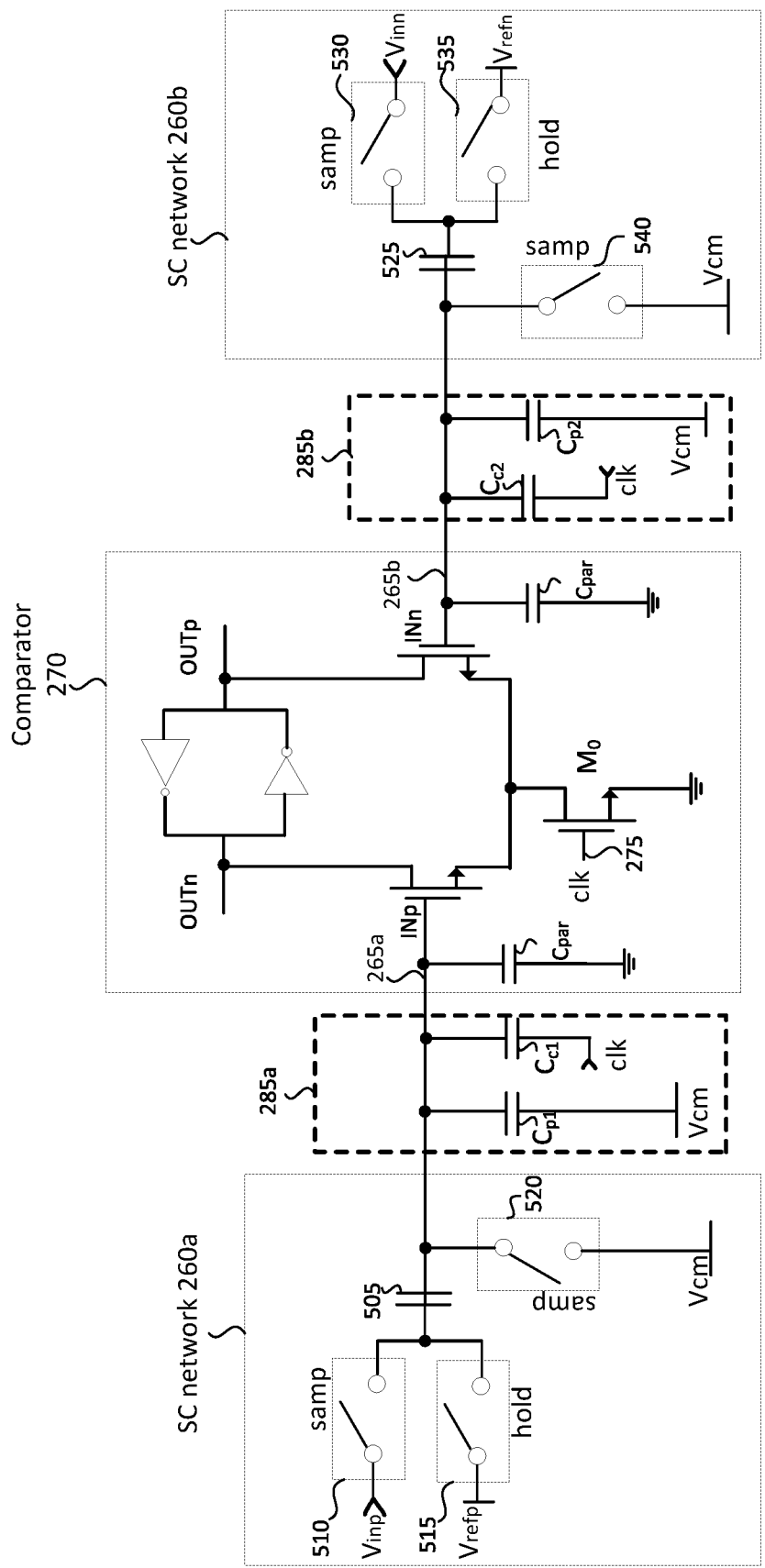
FIG. 5 depicts an exemplary adjustment circuit implemented around an SC charge-based subtraction and a dynamic comparator in a flash ADC.

FIG. 5 depicts the exemplary adjustment circuit implemented around an SC charge-based subtraction and a dynamic comparator in a flash ADC. In this depicted flash ADC example, the first SC network 260a is connected to the first input $IN_p$ of the comparator 270 and a second SC network 260b is connected to the second input $IN_n$ of the comparator 270.

The first SC network 260a includes a first sampling capacitor 505 connected through a first sampling switch 510 to a corresponding input voltage $V_{inp}$ and connected through a first holding switch 515 to a corresponding reference voltage $V_{refp}$. The first SC network 260a also includes a second sampling switch 520, with one terminal connected to the common-mode voltage $V_{cm}$ and the other terminal connected to the first input $IN_p$ of the comparator 270.

The second SC network 260b includes a second sampling capacitor 525 connected through a third sampling switch 530 to a corresponding input voltage $V_{inn}$ and connected through a second holding switch 535 to a corresponding reference voltage $V_{refn}$. The second SC network 260b also includes a fourth sampling switch 540, with one terminal connected to the common-mode voltage $V_{cm}$ and the other terminal connected to the second input $IN_n$ of the comparator 270.

The sampling switches 510, 520, 530, 540 and the holding switches 515, 535 may be controlled by controlling signals to perform the sampling and holding of corresponding input signals. The comparator 270 may compare the difference between ($V_{inp}-V_{inn}$) and ($V_{refp}-V_{refn}$).

The first adjustment circuit 285a and the second adjustment circuit 285b are arranged between the SC network 260a, 260b and the comparator 270. By introducing the adjustment circuit 285a, 285b, the need for an active preamplifier in the comparator may be removed, the switched-capacitor (SC) passive network (260a, 260b) may be directly connected to a fully dynamic comparator (e.g., the comparator 270) with minimal degradation in the comparator operation. The comparator input common-mode may be stable, and the comparator may achieve improved performance.

Figure 6:
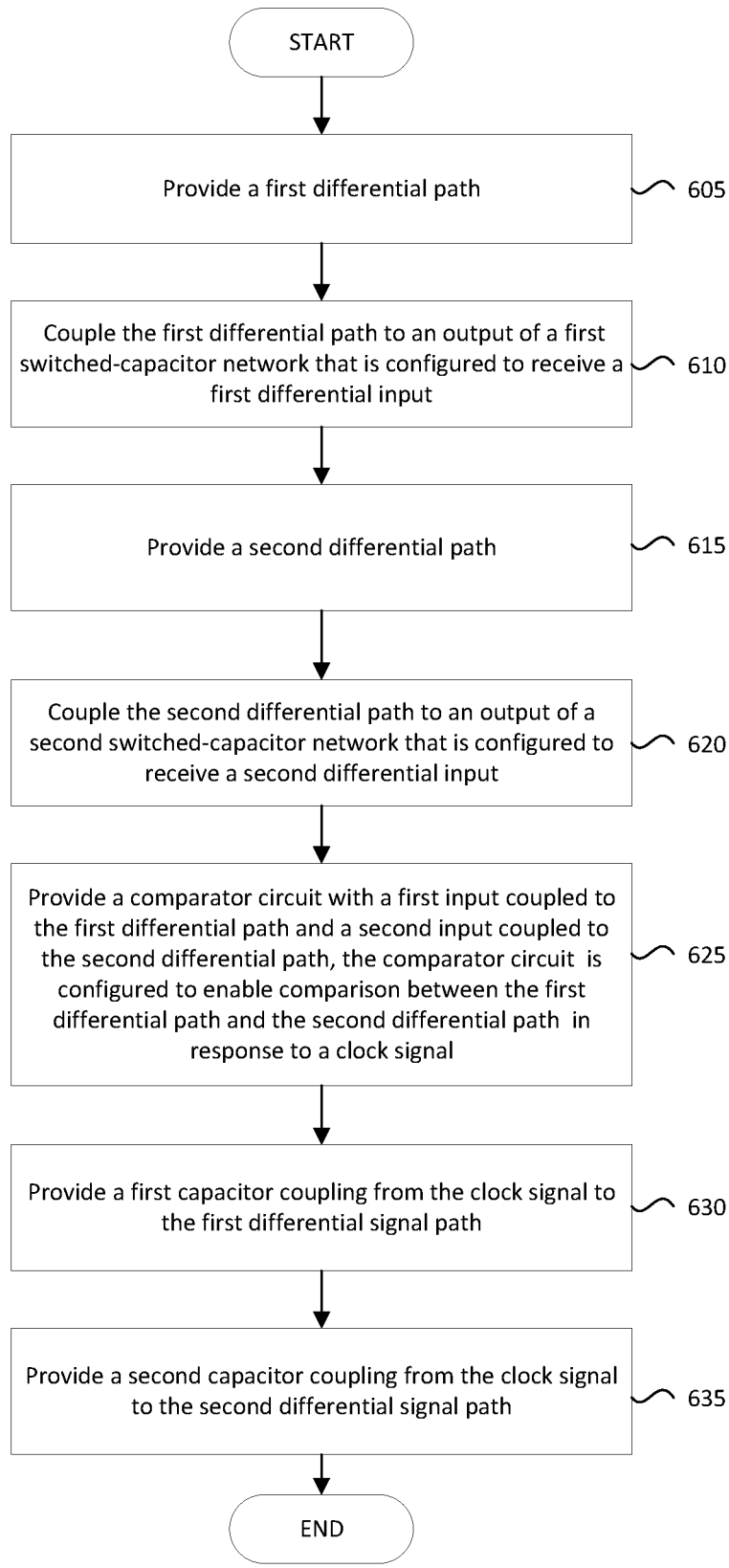
FIG. 6 depicts a flow chart of an exemplary method to reduce kickback noise of a comparator.

FIG. 6 depicts a flow chart of an exemplary method to reduce kickback noise of a comparator. A method includes, at 605, providing a first differential path (e.g., the differential path 265a) and, at 610, coupling the first differential path to an output of a first switched-capacitor network (e.g., the first switched-capacitor network 260a) that is configured to receive a first differential input (e.g., $V_{inp}$). The method also includes, at 615, providing a second differential path (e.g., the differential path 265b) and, at 620, coupling the second differential path to an output of a second switched-capacitor network (e.g., the second switched-capacitor network 260b) that is configured to receive a second differential input (e.g., $V_{inn}$).

The method includes, at 625, providing a comparator circuit (e.g., the comparator circuit 270) with a first input (e.g., $IN_p$) coupled to the first differential path and a second input (e.g., $IN_n$) coupled to the second differential path. The comparator circuit is configured to enable comparison between the first differential path and the second differential path in response to a clock signal (e.g., the clock signal 275). The method also includes, at 630, providing a first capacitor (e.g., the capacitor $C_{c1}$) coupling from the clock signal to the first differential signal path, and at 635, providing a second capacitor (e.g., the capacitor $C_{c2}$) coupling from the clock signal to the second differential signal path. By introducing the first capacitor and the second capacitor, kickback noise of the comparator may advantageously be reduced.

Figure 7A:
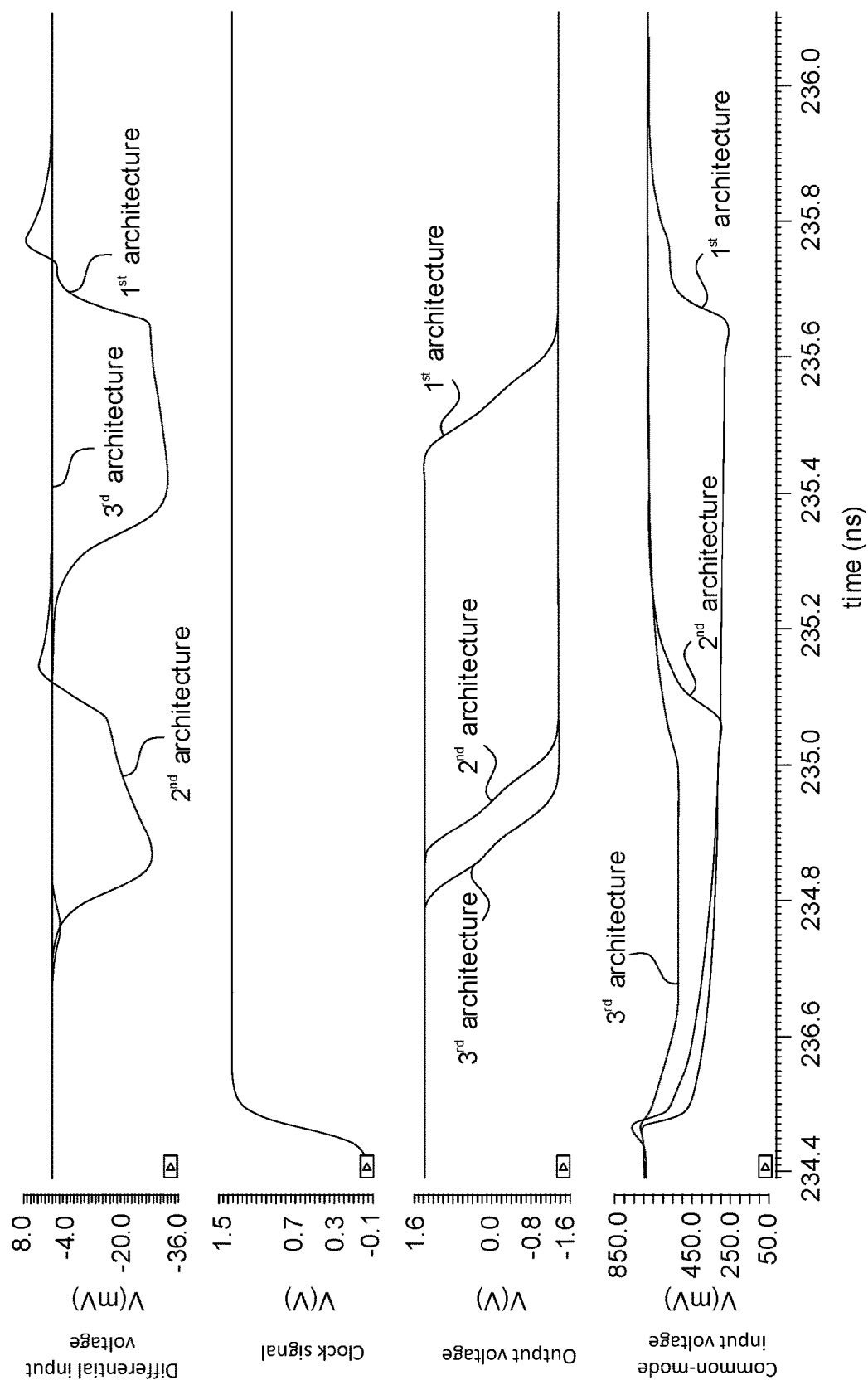
FIG. 7A depicts simulation results of exemplary comparator signal responses in a comparison.

FIG. 7A depicts simulation results of exemplary comparator signal responses in a comparison. A 200-run Monte Carlo Analysis is performed in this exemplary simulation. Simulation results show respective comparator differential inputs, comparison clock, differential outputs, and common-mode inputs for the response of three different architectures. A first architecture is a prior art architecture that a comparator is connected with a preamplifier and a latch. A second architecture (e.g., the architecture in FIG. 3A) replaces the preamplifier with an adjustment circuit, and the adjustment circuit only includes the second capacitor Cc (e.g., $C_{c1}$, $C_{c2}$). A third architecture (e.g., the architecture in FIG. 3B) replaces the preamplifier with an adjustment circuit, and the adjustment circuit includes both the first capacitor $C_P$ (e.g., $C_{p1}$, $C_{p2}$) and the second capacitor Cc (e.g., $C_{c1}$, $C_{c2}$). In addition, for the architecture in FIG. 3A, the random offset may be reduced from a standard deviation of 4 mV to 3.4 mV when the first capacitor $C_P$ the second capacitor Cc are added. The contribution of the input differential pair to the comparator offset may be reduced by 40% while the overall comparator offset may be lowered by 15%.

As shown in FIG. 7A, in response to the same clock signal, the comparator of the third architecture generates the output voltage faster than the first and the second architecture. Compared to the first and second architecture, the differential input voltage and the common-mode input voltage of the comparator of the third architecture have a very small drop. Also, as the second architecture introduced the second capacitor Cc, the common-mode input voltage of the second architecture has less drop than the first architecture. The simulation results are shown in FIG. 7B for the respective input common-mode and differential kickback voltages as well as the corresponding comparator time responses.

FIG. 7B depicts experimental results of comparison of different embodiments of exemplary adjustment circuits. As shown in the table, for the second architecture that only has only the second capacitor Cc, the comparator has an about 3 times faster response compared to the first architecture.

For the third architecture that has both the first capacitor $C_P$ (e.g., $C_{p1}$, $C_{p2}$) and the second capacitor Cc (e.g., $C_{c1}$, $C_{c2}$), the comparator has an about 3.33 times faster response with 3 and 17 times less common-mode and differential kickback voltages, respectively. By introducing the adjustment circuit explained in FIG. 3B, the comparator may achieve a faster response, and less sensitive to kickback effects.

Although various embodiments of the adjustment circuits may be implemented using reconfigurable programmable logic blocks (e.g., FPGA), other embodiments may be implemented in fixed instantiations (e.g., ASIC). While dedicated hard block circuitry in an ASIC implementation may not be reconfigurable once instantiated in an integrated circuit. For example, an ASIC implementation may, in some implementations, provide for a minimized platform with respect to, for example, power consumption and/or die area. In some embodiments, the adjustment circuit may only include the capacitor $C_p$ (e.g., $C_{p1}$, $C_{p2}$). The capacitor $C_p$ may also advantageously reduce the kickback noise.

Various examples of ADCs may be implemented using circuitry, including various electronic hardware. By way of example and not limitation, the hardware may include transistors, resistances, capacitors, switches, integrated circuits and/or other modules. In various examples, the ADC may include analog and/or digital logic, discrete components, traces and/or memory circuits fabricated on a silicon substrate including various integrated circuits. In some embodiments, the ADC may involve execution of preprogrammed instructions and/or software executed by a processor. For example, various switched-capacitor circuits may involve both hardware and software.

In various implementations, the communication system may communicate using suitable communication methods, equipment, and techniques. For example, the system may communicate with compatible devices (e.g., devices capable of transferring data to and/or from the system) using point-to-point communication in which a message is transported directly from a source to a receiver over a dedicated physical link (e.g., fiber optic link, infrared link, ultrasonic link, point-to-point wiring, daisy-chain). The components of the system may exchange information by any form or medium of analog or digital data communication, including packet-based messages on a communication network. Examples of communication networks include, e.g., a LAN (local area network), a WAN (wide area network), MAN (metropolitan area network), wireless and/or optical networks, and the computers and networks forming the Internet. Other implementations may transport messages by broadcasting to all or substantially all devices that are coupled together by a communication network, for example, by using omni-directional radio frequency (RF) signals. Still other implementations may transport messages characterized by high directivity, such as RF signals transmitted using directional (i.e., narrow beam) antennas or infrared signals that may optionally be used with focusing optics. Still other implementations are possible using appropriate interfaces and protocols such as, by way of example and not intended to be limiting, USB 2.0, FireWire, ATA/IDE, RS-232, RS-422, RS-485, 802.11 a/b/g/n, Wi-Fi, WiFi-Direct, Li-Fi, BlueTooth, Ethernet, IrDA, FDDI (fiber distributed data interface), token-ring networks, or multiplexing techniques based on frequency, time, or code division. Some implementations may optionally incorporate features such as error checking and correction (ECC) for data integrity, or security measures, such as encryption (e.g., WEP) and password protection.

A number of implementations have been described. Nevertheless, it will be understood that various modification may be made. For example, advantageous results may be achieved if the steps of the disclosed techniques were performed in a different sequence, or if components of the disclosed systems were combined in a different manner, or if the components were supplemented with other components. Accordingly, other implementations are within the scope of the following claims.

What is claimed is:

1. A circuit, comprising:
   a first differential path coupled to an output of a first switched-capacitor network that is configured to receive a first differential input;
   a second differential path coupled to an output of a second switched-capacitor network that is configured to receive a second differential input;
   a comparator circuit having a first input coupled to the first differential path and a second input coupled to the second differential path, wherein the comparator circuit is configured to enable comparison between the first differential path and the second differential path in response to a clock signal;
   a first capacitor coupled from the clock signal to the first differential signal path;
   a second capacitor coupled from the clock signal to the second differential signal path;
   a third capacitor coupled from a common mode voltage of the comparator circuit to the first differential signal path; and,
   a fourth capacitor coupled from the common mode voltage of the comparator circuit to the second differential signal path,
   wherein the first differential path comprises a first pre-amplifier circuit having an input coupled to the third capacitor, and an output coupled to the first capacitor, the second differential path comprises a second pre-amplifier circuit having an input coupled to the fourth capacitor, and an output coupled to the second capacitor.

2. The circuit of claim 1, wherein the third capacitor is a metal-oxide-metal capacitor.

3. The circuit of claim 2, wherein the fourth capacitor is a metal-oxide-metal capacitor.

4. The circuit of claim 1, wherein the third capacitor is a metal-insulator-metal (MIM) capacitor.

5. The circuit of claim 4, wherein the fourth capacitor is a metal-insulator-metal (MIM) capacitor.

6. The circuit of claim 1, wherein the first capacitor is a metal-insulator-metal capacitor.

7. The circuit of claim 6, wherein the second capacitor is a metal-insulator-metal capacitor.

8. An analog-to-digital converter (ADC), comprising:
   a first switched-capacitor network having an input configured to receive a first differential input and an output coupled to a first differential path;
   a second switched-capacitor network having an input configured to receive a second differential input and an output coupled to a second differential path;
   a comparator circuit having a first input coupled to an output of the first differential path and a second input coupled to an output of the second differential path, wherein the comparator circuit is configured to enable comparison between the first differential path and the second differential path in response to a clock signal;
   a first capacitor coupled from the clock signal to the first differential signal path;
   a second capacitor coupled from the clock signal to the second differential signal path;
   a third capacitor coupled from a common mode voltage of the comparator circuit to the first differential signal path; and,
   a fourth capacitor coupled from the common mode voltage of the comparator circuit to the second differential signal path,
   wherein the first differential path comprises a first pre-amplifier having an input coupled to the third capacitor, and an output coupled to the first capacitor, the second differential path comprises a second pre-amplifier having an input coupled to the fourth capacitor, and an output coupled to the second capacitor.

9. The ADC of claim 8, wherein the third capacitor is a metal-oxide-metal capacitor.

10. The ADC of claim 9, wherein the fourth capacitor is a metal-oxide-metal capacitor.

11. The ADC of claim 8, wherein the ADC is a successive approximation register (SAR) ADC.

12. A method, comprising:
    providing a first differential path, wherein the first differential path is coupled to an output of a first switched-capacitor network that is configured to receive a first differential input;
    providing a second differential path, wherein the second differential path is coupled to an output of a second switched-capacitor network that is configured to receive a second differential input;
    providing a comparator circuit with a first input coupled to the first differential path and a second input coupled to the second differential path, wherein the comparator circuit is configured to enable comparison between the first differential path and the second differential path in response to a clock signal;
    providing a first capacitor, wherein the first capacitor is coupled from the clock signal to the first differential signal path;
    providing a second capacitor, wherein the second capacitor is coupled from the clock signal to the second differential signal path;
    coupling a third capacitor from a common mode voltage of the comparator circuit to the first differential signal path;
    coupling a fourth capacitor from the common mode voltage of the comparator circuit to the second differential signal path;
    providing a first pre-amplifier circuit with an input coupled to the third capacitor, and an output coupled to the first capacitor; and,
    providing a second pre-amplifier circuit with an input coupled to the fourth capacitor, and an output coupled to the second capacitor.

13. The method of claim 12, wherein the third capacitor is a metal-oxide-metal capacitor.

14. The method of claim 13, wherein the fourth capacitor is a metal-oxide-metal capacitor.

* * * * *